(12) United States Patent
Sturm et al.

(10) Patent No.: US 6,259,202 B1
(45) Date of Patent: Jul. 10, 2001

(54) PLASMA TREATMENT OF CONDUCTIVE LAYERS

(75) Inventors: James C. Sturm, Princeton, NJ (US); Chung-Chih Wu, Taipei (TW)

(73) Assignee: The Trustees of Princeton University, Princeton, NJ (US)

(*) Notice: Subject to any disclaimer, the term of this patent is extended or adjusted under 35 U.S.C. 154(b) by 0 days.

(21) Appl. No.: 09/202,152

(22) PCT Filed: Jun. 12, 1997

(86) PCT No.: PCT/US97/10252

§ 371 Date: May 5, 1999

§ 102(e) Date: May 5, 1999

(87) PCT Pub. No.: WO97/48115

PCT Pub. Date: Dec. 18, 1997

Related U.S. Application Data (60) Provisional application No. 60/019,657, filed on Jun. 12, 1996.

(51) Int. Cl.[7] ............................. H01J 1/62; H01J 63/04; B05D 5/12; H05H 1/00; G09G 3/22
(52) U.S. Cl. .................. 313/504; 313/506; 313/507; 313/509; 437/40; 427/535; 427/38; 427/77; 427/78; 427/99; 345/75; 257/79; 257/77
(58) Field of Search .................... 136/249, 258; 313/500, 501, 504, 506–507, 509; 437/40–41, 275, 101, 937, 909, 84, 87, 235, 238, 249, 941; 427/38, 77–78, 99; 357/23.7, 2; 257/77, 79, 11; 445/58–59

(56) References Cited

U.S. PATENT DOCUMENTS

| | | |
|---|---|---|
| 4,155,008 * | 5/1979 | James et al. ................ 250/281 |
| 4,431,683 | 2/1984 | Sasaki et al. .. |
| 4,859,617 | 8/1989 | Nomoto et al. .. |
| 4,895,734 | 1/1990 | Yoshida et al. .. |
| 4,992,839 | 2/1991 | Shirai . |
| 5,273,920 | 12/1993 | Kwasnick et al. .. |
| 5,281,546 | 1/1994 | Possin et al. .. |
| 5,294,870 | 3/1994 | Tang et al. ............... 313/504 |
| 5,419,783 | 5/1995 | Noguchi et al. .. |
| 5,463,271 * | 10/1995 | Geis et al. ............ 313/346 R |
| 5,600,200 * | 2/1997 | Kumar et al. ......... 313/346 R |
| 5,616,368 * | 4/1997 | Jin et al. ................. 427/535 |
| 5,751,262 * | 5/1998 | Browning et al. ......... 345/75 |
| 5,861,707 * | 1/1999 | Kumar .................... 313/309 |

OTHER PUBLICATIONS

C.E. Johnson et al., "Luminescent Iridium(I), Rhodium(I), and Platinum(II) Dithiolate Complexes," 105 *Jurnal of the American Chemical Society*, 1795 (1983).

Hosokawa et al., "Highly Efficient Blue Electroluminescence from a Distryrylarylene Emitting Layer with a New Dopant," 67 *Applied Physics Letters* 3853–55 (Dec. 1995).

Adachi et al., "Blue Light–emitting Organic Electroluminescent Devices," 56 *Applied Physics Letters* 799–801 (Feb. 1990).

Burrows et al., "Color–Tunable Organic Light Emitting devices," 69 *Applied Physics Letters* 2959–61 (Nov. 1996).

* cited by examiner

*Primary Examiner*—Michael H. Day
*Assistant Examiner*—Mack Haynes
(74) *Attorney, Agent, or Firm*—Kenyon & Kenyon (57) ABSTRACT

A method for modifying the surface properties such as work function of semiconducting and conducting layers by plasma treatment. Also disclosed are electrical devices such as organic light emitting devices of enhanced performance owing to the use of plasma treatment-modified semiconducting or conducting layers.

38 Claims, 5 Drawing Sheets

PLASMA TREATMENT OF CONDUCTIVE LAYERS

CROSS-REFERENCE TO RELATED APPLICATIONS

This application claims the benefit of U.S. Provisional Application No. 60/019,657, filed Jun. 12, 1996.

FIELD OF THE INVENTION

This invention relates to the field of organic optoelectronics, and more particularly to the enhancement of optoelectronic performance by the treatment of conductive layers used in optoelectronic devices.

BACKGROUND OF THE INVENTION

Organic light emitting devices (OLEDs) make use of organic thin film materials which emit light when excited by electric current. These devices usually consist of a sandwich structure with organic thin films deposited onto a transparent substrate and covered by top metal cathode contacts. Between the transparent substrate and the organic thin films is a layer of transparent, conducting material which serves as an anode.

The organic thin films typically consist of an emission layer between a hole transporting layer and an electron transporting layer. When current is applied between the cathode and anode, the emission layer provides a recombination site for electrons injected from the electron transporting layer and holes from the hole transporting layer. This recombination results in the emission of light having a characteristic wavelength depending on the organic materials used. Alternatively, single-layer organic or organic blend layers can be used instead of such multilayer organic thin film systems.

Because of its transparency, high conductivity and efficiency as a hole injector into organic materials, indium-tin-oxide ("ITO") is widely used as the anode material in OLEDS. Because the organic thin films are in direct contact with the ITO in OLEDs, the surface properties of ITO are expected to directly affect the characteristics of these devices. Consequently, ITO layers which are not properly cleaned or have other imperfections can result in poor device performance, such as shorting, unstable I-V characteristics, higher drive voltages and poor reliability.

To minimize the possibility of poor device performance due to the ITO layer, conventional ITO treatments usually include combinations of cleaning steps, such as sonification, boiling and rinsing in materials such as detergents, deionized ("DI") water and organic solvents, and degreasing in organic solvent vapor. Such cleaning techniques, however, are not often sufficiently reliable or reproducible, and consequently, irregular variations in device performance often occurs.

SUMMARY OF THE INVENTION

The present invention provides a method for modifying the surface properties, such as chemical composition, work function, cleanliness and roughness, of semiconducting or conducting layers by plasma treatment. The present invention also provides for electrical devices of enhanced performance owing to the use of plasma treatment-modified semiconducting or conducting layers.

In one embodiment of the invention, a plasma treatment is used to modify at least one of the conductive layers used in an OLED. This device performance is greatly enhanced by the plasma treatment.

One advantage of the present invention is that it provides a reliable method for providing conductive layers of desired work function, cleanliness and performance.

Another advantage of the present invention is that it provides a reliable method for providing electrical devices, and particularly OLEDs, of enhanced performance.

Yet another advantage of the present invention is that it provides electrical devices, and particularly OLEDs, having enhanced performance.

DETAILED DESCRIPTION

The present invention makes use of a plasma treatment to modify the surface of conductive layers used in electrical devices such as OLEDs. By including such a plasma treatment to conductive layers, OLED performance is greatly enhanced in terms of qualities such as I–V characteristics, drive voltages, efficiency and reliability. The conductive layers in OLEDs are typically materials such as ITO, Pt, Al, Ag, Au, Mg, Mg/Ag, and Li/Al. ITO and Pt are the preferred materials for transparent and reflective anode conductive layers, respectively.

Figure 1:
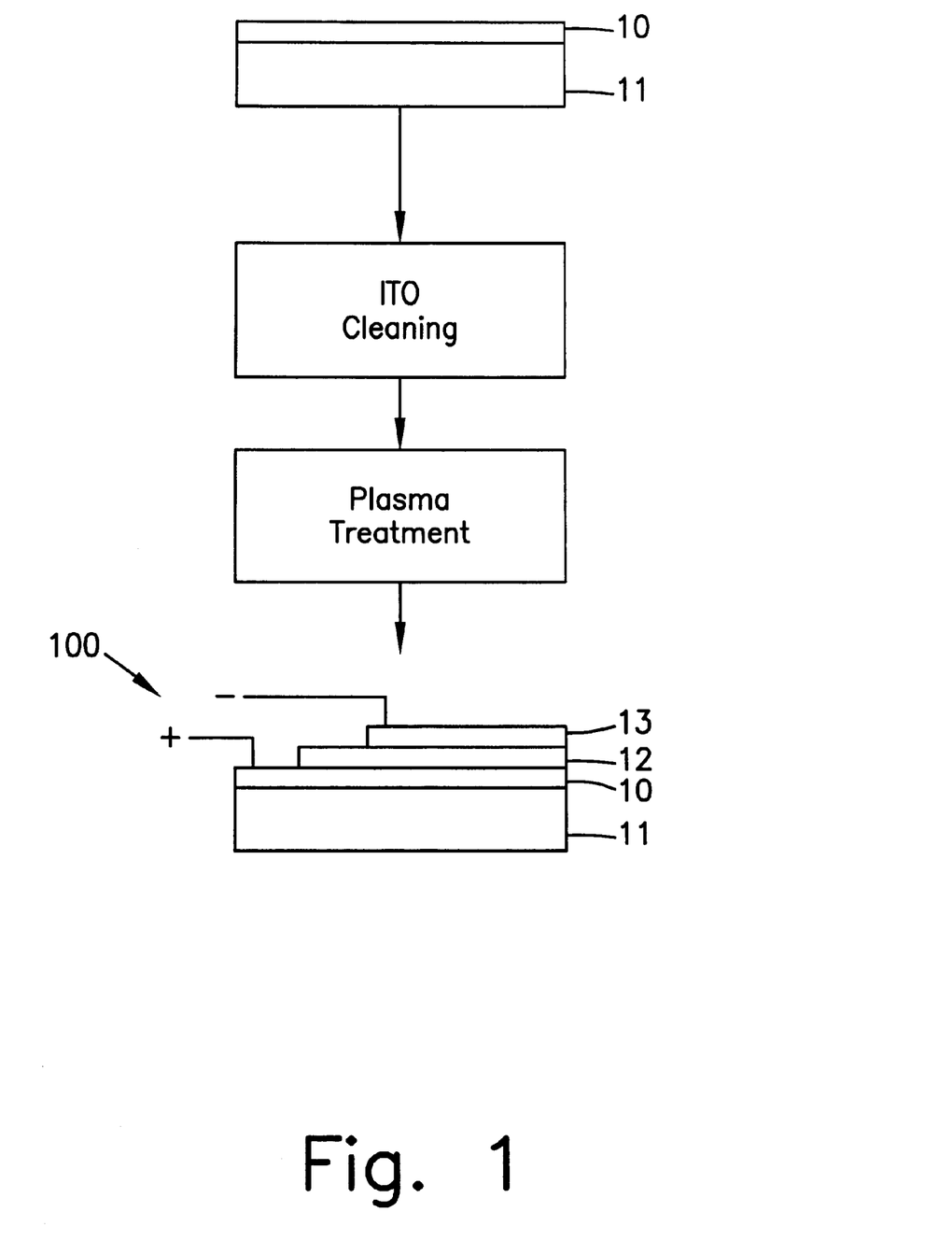
FIG. 1 is a schematic flowchart showing the steps for fabricating an OLED in accordance with the present invention.

The present invention includes a method for making OLEDs of enhanced performance. As shown in FIG. 1, the first step in making OLED 100 is depositing conductive layer 10 onto substantially transparent substrate 11 to serve as an anode. Conductive layer 10 is substantially transparent and is preferably made of ITO. Substrate 11 can be made of any suitable transparent material, such as quartz, sapphire, plastic, or preferably glass. The preferred method of depositing the ITO layer 10 is by electron-beam evaporation or sputtering. After ITO layer 10 is deposited onto substrate 11, the ITO is cleaned by wet cleaning steps in detergents, water or solvents as is known in the art. Suitable detergents for cleaning ITO layer are known in the art, although TERGITOL™ (J.T. Baker Co.) is preferred. Suitable solvents include acetone, methanol and preferably trichloroethane ("TCA"). It is preferred that this step include cleaning by swabbing and sonification with TERGITOL, rinsing in DI water, degreasing by flushing in warm TCA, and finally rinsing in acetone and methanol.

After cleaning, ITO layer 10 is subjected to a plasma treatment. The gas used in the plasma treatment can be oxygen, hydrogen, argon, or gas mixtures containing these species, for example. Oxygen plasma, which tends to increase ITO work function, is the most preferred plasma for OLED applications. This step can be carried out in either a barrel-type plasma system or a parallel-type plasma system, as are known in the art. Power densities used during the plasma treatment range from 25 to 200 mW/cm$^2$. There is no intentional heating of the sample during the plasma treatment.

Organic layers 12 are deposited onto ITO layer 10 after the plasma treatment. The organic material chosen for deposition will depend on the color or combination of colors desired for use. For example, if blue is the desired emission color, the emissive layer of OLED is made from any suitable blue light-emissive organic compound such as, for example, trivalent metal quinolate complexes, Schiff base divalent metal complexes, metal acetylacetonate complexes, metal bidentate ligand complexes, bisphosphonates, metal maleontriledithiolate complexes, molecular charge transfer complexes, aromatic and heterocyclic polymers and rare earth mixed chelates. The metal bidentate complexes have the formula $MDL^4_2$ wherein M is selected from trivalent metals of Groups 3–13 of the Periodic Table and Lanthanides. The preferred metal ions are $Al^{+3}$, $Ga^{+3}$, $In^{+3}$ and $Sc^{+3}$. D is a bidentate ligand such as 2-picolylketones, 2-quinaldylkentones and 2-(o-phenoxy) pyridine ketones. The preferred groups for $L^4$ include acetylacetonate, compounds of the formula $OR^3R$ wherein $R^3$ is selected from Si and C, and R is selected from hydrogen, substituted and unsubstituted alkyl, aryl and heterocyclic groups; 3,5-di(t-bu) phenol; 2,6-di(t-bu) phenol; 2,6-di(t-bu) cresol; and $H_2Bpz_2$. By way of example, the wavelength resulting from measurement of photoluminescence in the solid state of aluminum (picolymethylketone) bis [2,6-di(t-bu) phenoxide] is 420 nm. The cresol derivative of this compound also measured 420 nm. Aluminum (picolylmethylketone) bis (OsiPh$_3$) and scandium (4-methoxy-picolylmethylketone) bis (acetylacetonate) each measured 433 nm, while aluminum [2-(O-phenoxy) pyridine] bis [2,6-di(t-bu) phenoxide] measured 450 nm.

Examples of green emissive layer OLED materials include tin (iv) metal complexes, such as those having the formula $SnL^1_2L^2_2$ where $L^1$ is selected from salicylaldehydes, salicyclic acid or quinolates (e.g. 8-hydroxyquinoline). $L^2$ can be substituted and unsubstituted alkyl, aryl and heterocyclic groups. When $L^1$ is a quinolate and $L^2$ is a phenyl, for example, the tin (iv) metal complex will have an emission wavelength of 504 nm.

Examples of red emissive layer OLED materials include divalent metal maleonitriledithiolate ("mnt") complexes, such as those described by C. E. Johnson et al. in "Luminescent Iridium(I), Rhodium(I), and Platinum(II) Dithiolate Complexes," 105 *Journal of the American Chemical Society* 1795 (1983). For example, the mnt [Pt (Pph$_3$)$_2$] has a characteristic wavelength emission of 652 nm.

Additional OLED materials are known in the art (see, e.g., U.S. Pat. No. 5,294,870 to Tang et al., entitled "Organic Electroluminescent Multicolor Image Display Device"; Hosokawa et al., "Highly efficient blue electroluminescence from a distyrylarylene emitting layer with a new dopant," 67 *Applied Physics Letters* 3853–55 (Dec. 1995); Adachi et al., "Blue light-emitting organic electroluminescent devices," 56 *Applied Physics Letters* 799–801 (Feb. 1990); Burrows et al., "Color-Tunable Organic Light Emitting Devices," 69 *Applied Physics Letters* 2959–61 (Nov. 1996)). The entire disclosures of these references are hereby incorporated by reference. Distyrylarylene derivatives such as those described in Hosokawa et al. are a preferred class of compounds. Other preferred OLEDs are described in the copending applications discussed below.

After the organic layers 12 are deposited, conductive layer 13 is deposited as a cathode layer to complete the OLED, as shown in FIG. 1.

The plasma treatment of semiconductive or conductive layers in accordance with the present invention does not degrade the bulk properties of these layers. Rather, the plasma treatment affects only the region at or near the layer surface, which in turn affects the performance characteristics of the electronic device. It is therefore concluded that changes in device performance are related to the treated semiconductor or conductor surface properties.

The mechanism by which the plasma treatment affects OLED performance is not presently known with certainty. While not wishing to be bound by theory, however, it is suspected that the influence of the plasma treatment on ITO surface work function has a significant effect on OLED performance. Other factors such as the removal of organic residue from the ITO surface and the reduction in surface roughness may also influence OLED performance.

The present invention is also applicable to so-called "top-emitting" OLEDs, in which emitted light is projected in a direction away from the substrate. In such devices, an anode layer is deposited onto a substrate, with either of the anode layer or the substrate being reflective. The organic layer(s) are then deposited over the anode, and a substantially transparent cathode is deposited over the organic layer(s). The reflective anode is made of Pt, for example. In accordance with the present invention, the anode is subjected to a plasma treatment prior to the deposition of the organic layer(s). The plasma treatment has similar effects on the top-emitting device performance as it has on the non-inverted device, namely an enhancement in I–V characteristics, drive voltages, efficiency and reliability.

The present invention is also applicable to OLEDs in which the location of the anode and cathode about the organic layer(s) are reversed. In such devices, a plasma treatment is used to modify the surface characteristics of the cathode layer before depositing the organic layer(s).

The present invention is used to provide efficient, high brightness, monochromatic or multicolor, flat panel displays of any size. This widens the scope of this invention to include displays as small as a few millimeters to as large as the size of a building. The images created on such displays could be text or illustrations in full color, in any resolution depending on the size of the individual LED's. Display devices of the present invention are therefore appropriate for an extremely wide variety of applications including billboards and signs, computer monitors, telecommunications devices such as telephones, televisions, large area wall screens, theater screens and stadium screens. Embodiments of the present invention in which the emitted light is directed in a direction away from the substrate are particularly useful for xerographic applications, as such embodiments allow for close positioning to print paper without the use of lenses.

Although the present invention is described with specific reference to OLEDs, it may also be useful for other applications in which the surface characteristics of semiconductor or conductor materials, such as chemical composition, work function, cleanliness and roughness, are modified by plasma treatment.

The subject invention as disclosed herein may be used in conjunction with co-pending applications: "High Reliability, High Efficiency, Integratable Organic Light Emitting Devices and Methods of Producing Same", Ser. No. 08/774,119 (filed Dec. 23, 1996), now U.S. Pat. No. 6,046,543; "Novel Materials for Multicolor LED's", Ser. No. 08/850,264 (filed May 2, 1997), now U.S. Pat. No. 6,045,930; "Electron Transporting and Light Emitting Layers Based on Organic Free Radicals", Ser. No. 08/774,120 (filed Dec. 23, 1996), now U.S. Pat. No. 5,811,833; "Multicolor Display Devices", Ser. No. 08/772,333 (filed Dec. 23, 1996), now U.S. Pat. No. 6,013,982; "Red-Emitting Organic Light Emitting Devices (LED's)", Ser. No. 08/774,087 (filed Dec. 23, 1996), now U.S. Pat. No. 6,048,630; "Driving Circuit For Stacked Organic Light Emitting Devices", Ser. No. 08/792,050 (filed Feb. 3, 1997, now U.S. Pat. No. 5,757,139; "High Efficiency Organic Light Emitting Device Structures", Ser. No. 08/772,332 (filed Dec. 23, 1996),now U.S. Pat. No. 5,834,893; "Vacuum Deposited, Non-Polymeric Flexible Organic Light Emitting Devices", Ser. No. 08/789,319 (filed Jan. 23, 1997), now U.S. Pat. No. 5,844,363; "Displays Having Mesa Pixel Configuration", Ser. No. 08/794,595 (filed Feb. 3, 1997), now U.S. Pat. No. 6,091,195; "Stacked Organic Light Emitting Devices", Ser. No. 08/792,046 (filed Feb. 3, 1997), now U.S. Pat. No. 5,917,280; "High Contrast Transparent Organic Light Emitting Device Display", Ser. No. 08/821,380 (filed Mar. 20, 1997), now U.S. Pat. No. 5,986,401; "Organic Light Emitting Devices Containing A Metal Complex of 5-Hydroxy-Quinoxaline as A Host Material", Ser. No. 08/838,099 (filed Apr. 14, 1997), now U.S. Pat. No. 5,861,219; "Light Emitting Devices Having High Brightness", Ser. No. 08/844,353 (filed Apr. 18, 1997), still pending; "Organic Semiconductor Laser", (filed May 19, 1997), Ser. No. 08/859,468 (filed May 19, 1997), now U.S. Pat. No. 6,111,902; "Saturated Full Color Stacked Organic Light Emitting Devices", Ser. No. 08/858,994 (filed May 20, 1997), now U.S. Pat. No. 5,932,895; "An Organic Light Emitting Device Containing a Hole Injection Enhancement Layer", Ser. No. 08/865,491 (filed May 29, 1997), now U.S. Pat. No. 5,998,803; U.S. patent application Ser. No. 08/354,674, now U.S. Pat. No. 5,707,745; Ser. No. 08/613,207, now U.S. Pat. No. 5,703,436; Ser. No. 08/632,322, now U.S. Pat. No. 5,757,026; Ser. No. 08/779,141, now U.S. Pat. No. 5,985,141; and Ser. No. 08/789,319, now U.S. Pat. No. 5,844,363, each of which is also incorporated herein by reference in its entirety.

The present invention is further described in the following non-limiting examples.

EXAMPLE 1

OLEDs having ITO layer anodes were fabricated according to the following method.

ITO coated glass substrates were purchased from Donnelly Applied Films Co. The 1.1 mm thick polished glass was coated with a 200 Å $SiO_2$ barrier layer and a 1400 Å ITO film. ITO was sputtered from an $In_2O_3$—$SnO_2$ (90 wt %–10 wt %) oxide target in an $Ar/O_2$ ambient at an elevated temperature using a planar dc magnetron sputtering system. The ITO was annealed in situ during the deposition and no post deposition annealing was performed.

Prior to their use, the ITO-coated glass substrates were cleaned by swabbing and sonification with detergent/DI water, rinsing in DI water, degreasing by flushing the ITO surface with convection flow in warm TCA, and finally rising in acetone and methanol. The substrates were then used as cleaned or treated by using a plasma before deposition of the organic layer. For the plasma treatment, the samples were exposed to plasmas of different gases in a parallel-plate type plasma reactor configured in the reactive ion etching mode. In this system, a rf power of 25W corresponds to a power density of about 50 mW/cm$^2$.

The surface roughness of the plasma treated ITO layers, as measured by atomic force microscopy, was found to be 2.2 nm, 1.6 nm and 1.7 nm for the as-grown, oxygen plasma, and hydrogen plasma treated ITO samples, respectively.

The organic materials deposited onto the ITO-coated glass substrates were single-layer doped polymer devices in which the hole-transport matrix polymer poly (N-vinylcarbazole) ("PVK") contained dispersed electron transport molecules, such as 2-(4-biphenyl)-5(4-tert-butylphenyl)-1,3,4-oxadiazole ("PBD") or tris (8-hydroxy quinolate) aluminum ("Alq"), and fluorescent dyes as efficient emission centers. PVK:PBD:coumarin 6 ("C6") (100:40:0.3 by weight) was used for green devices, and PVK:Alq:nile red (100:40:0.2 by weight) was used for orange-red devices. These layers were deposited by spin-coating onto the ITO-coated glass substrates. The organic film thickness was about 1050 Å.

After the polymer layers were deposited, top metal cathode contacts consisting of 1200 Å Mg:Ag alloy and 800 Å Ag were deposited through a shadow mask with an array of 2 mm×2 mm holes. All spin-coating, device processing, including direct loading into the evaporator for metallization, and device characteristics were carried out under a dry nitrogen atmosphere in a glove box.

Figure 2:
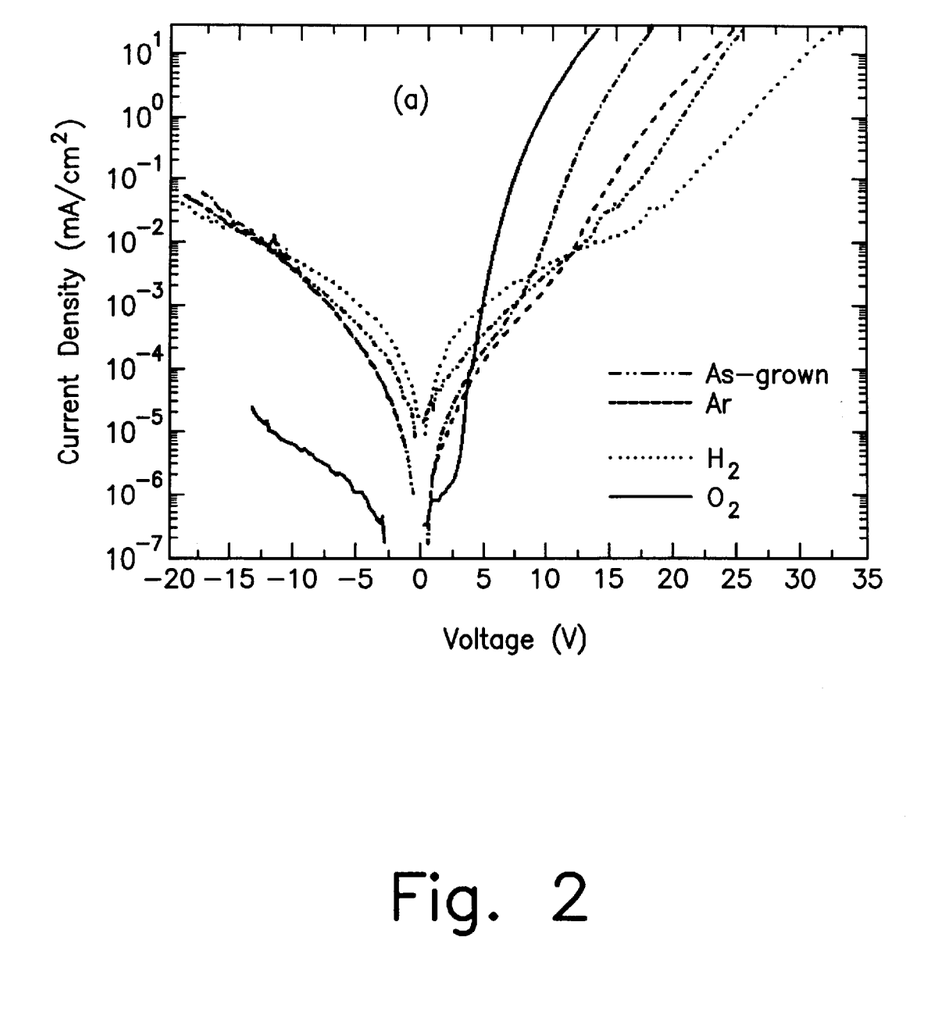
FIG. 2 shows I–V characteristics for OLEDs having plasma treated ITO layers.
Figure 3:
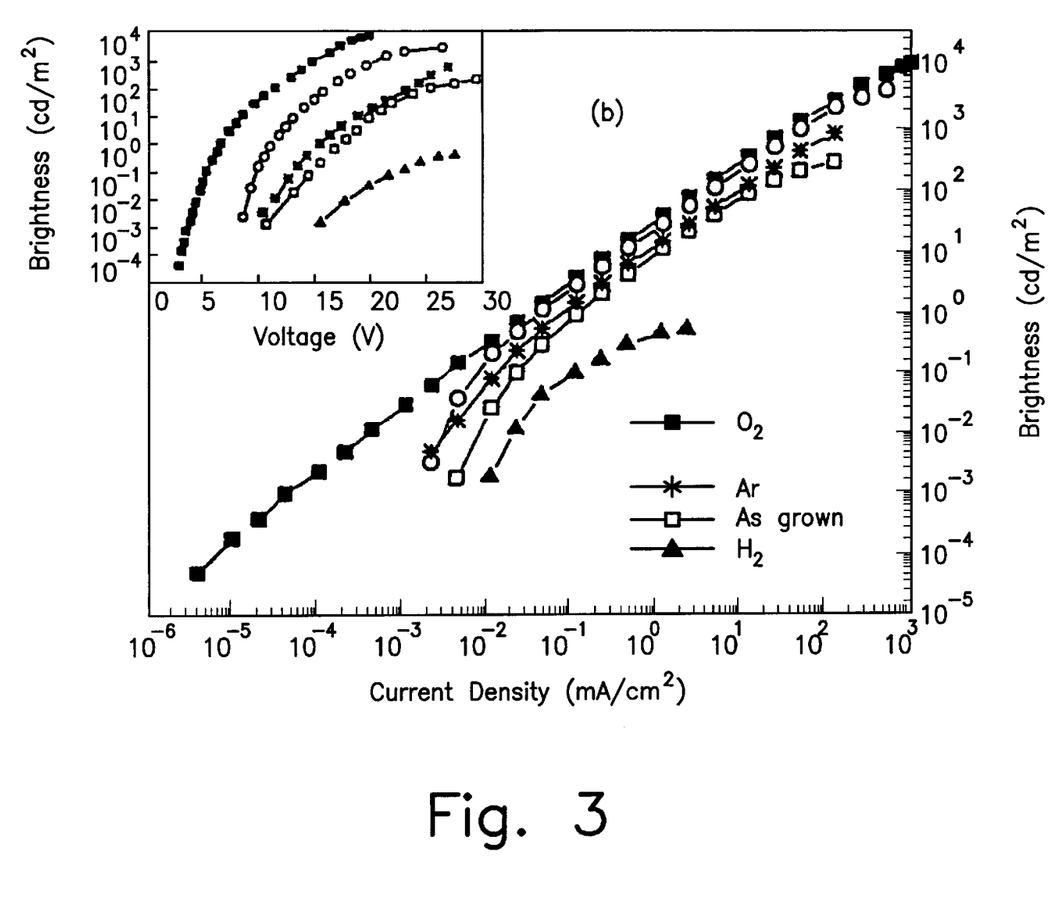
FIG. 3 shows the brightness-current and brightness-voltage characteristics for OLEDs having plasma treated ITO layers.

FIG. 2 shows I–V characteristics for OLEDs having ITO layers which were treated with different plasmas. FIG. 3 shows the corresponding brightness-current and brightness-voltage characteristics, illustrating the effect of plasma treatments on OLED efficiency. All forward I–V curves have two regimes, a low current regime with a weaker voltage dependence and a high current regime with a steeper current rise with voltage. In all cases, the forward bias low current regime, referred to as "leakage," is symmetrical to its reverse bias counterpart. Light emission is observed only in the high current regime, referred to as the "bipolar" regime.

As can be seen from FIG. 2, the various plasma treatments considerably affect the turn-on voltage of the bipolar current, the leakage current, and the quantum efficiency. Devices made on cleaned as-grown ITO had a turn-on voltage of about 12V and an external quantum efficiency at 2.5 mA/cm$^2$ of 0.28% photon/electron. The Ar plasma treatment reduced the turn-on voltage to 11V and increased efficiency to 0.35%. The oxygen plasma treatment dramatically reduced the turn-on voltage to 3V and increased efficiency to 1%. On the other hand, the hydrogen plasma treatment increased the turn-on voltage to 17V and reduced efficiency to 0.007%.

Figure 4:
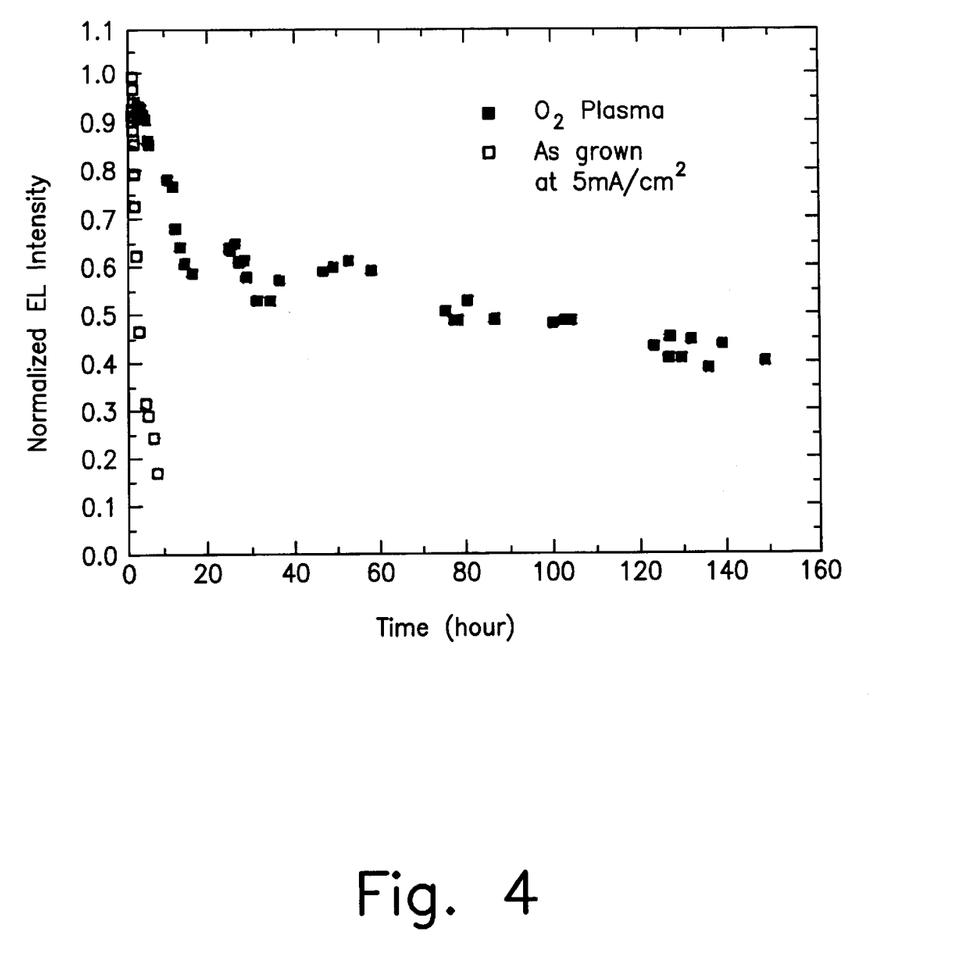
FIG. 4 is a plot of OLED brightness as a function of time for plasma treated ITO compared to untreated ITO.

A further consequence of improved OLEDs which include oxygen-plasma treated ITO is an enhancement in reliability and maximum allowed current before catastrophic breakdown. As shown in FIG. 4, the lifetime of an OLED made with oxygen-plasma treated ITO was found to be at least two orders of magnitude longer than that of an OLED which included a cleaned as-grown ITO.

EXAMPLE 2

Figure 5:
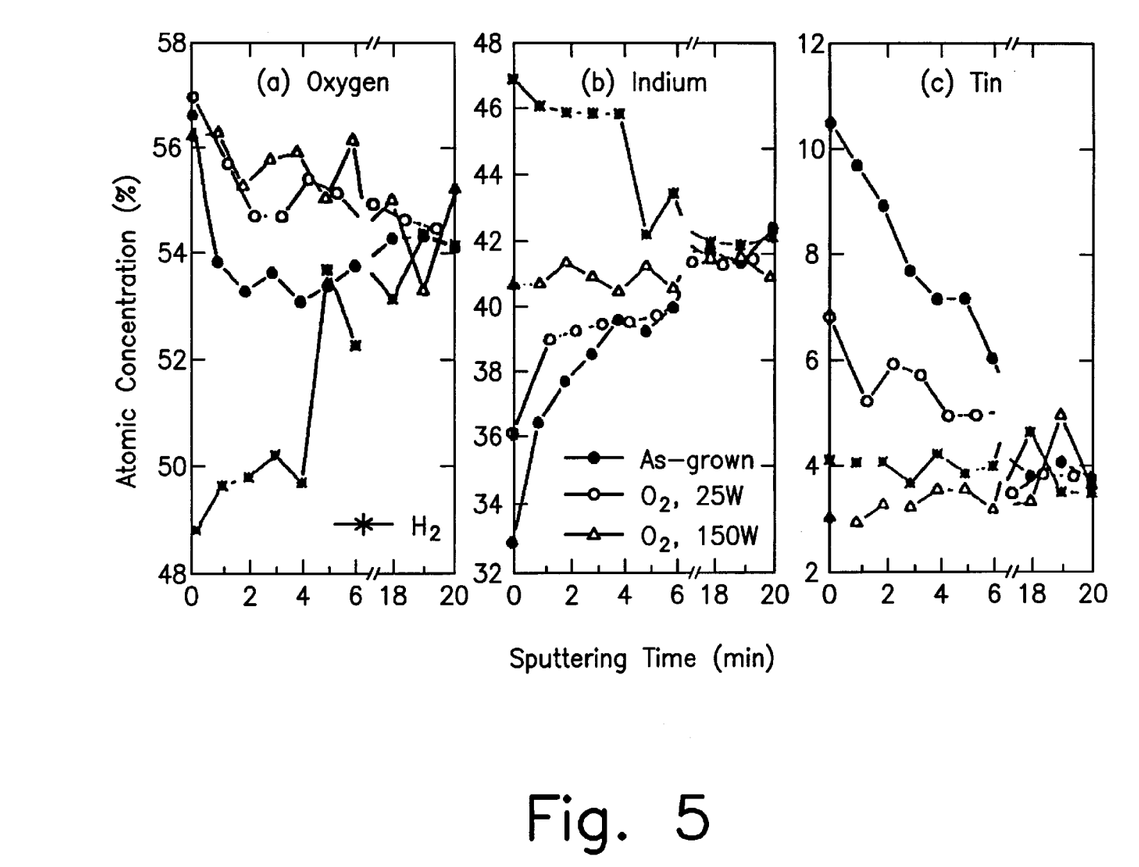
FIG. 5 shows compositional profiles for plasma treated ITO layers.

OLEDs were prepared as described in Example 1. Composition profiles of the ITO surfaces were obtained via Auger electron spectroscopy depth profiling. As shown in FIG. 5, the as-grown ITO was Sn-rich and In-deficient near the surface as compared to the bulk. The Sn:In atomic ratio near the surface was about 1:3, while it was about 1:10 in the bulk. The oxygen plasma treatment lowered the ITO surface Sn:In ratio to 1:6 and increased the surface oxygen concentration. The hydrogen plasma also reduced the Sn surface concentration, but substantially depleted the surface oxygen concentration. This is evidence for an electrochemical reduction-oxidation mechanism near the ITO surface in the reducing hydrogen plasma and the oxidizing oxygen plasma, respectively.

The improvement in device performance resulting from the oxygen plasma treatment, as described in Example 1, suggests that the surface chemical composition might play a role in increasing the hole injection ability at the ITO/organic layer interface. ITO is a heavily doped and degenerate n-type indium oxide with both Sn dopants and oxygen vacancies contributing to its conduction. The enhancement of hole injection may therefore be due to an increase in the work function of the ITO as the surface Sn:In ratio is decreased and the oxygen concentration is increased. Ultra-violet photoemission spectroscopy measurements on the oxygen-treated ITO surfaces showed an increase in the work function of about 100–300 meV over the cleaned as-grown ITO surfaces. Ultra-violet photoemission spectroscopy on the hydrogen-treated ITO surfaces showed a decrease in the work function of about 100 meV over the cleaned as-grown ITO surfaces. Furthermore, the effects of the plasma treatments appear to be reversible. That is, an oxygen treatment following a hydrogen treatment produced results similar to those in which only an oxygen treatment was performed.

The present invention provides a reliable and effective method for modifying the surface properties such as work function of semiconducting or conducting layers by plasma treatment. When applied to OLEDs, this method results in significant enhancements in device performance which have not been previously known by the modification of conductive layers alone.

Those with skill in the art may recognize various modifications to the embodiments of the invention described and illustrated herein. Such modifications are meant to be covered by the spirit and the scope of the appended claims.

What is claimed is:

1. An electrical device comprising a semiconducting or conducting layer having a work function modified by plasma treatment, said plasma treatment selected from the group consisting of treatment with an oxygen-containing species thereby increasing the work function by about 100 to about 300 meV and treatment with a hydrogen-containing species thereby decreasing the work function by about 100 meV.

2. The electrical device of claim 1 wherein said plasma treatment is with an oxygen-containing species thereby increasing the work function by about 100 to about 300 meV.

3. The electrical device of claim 1 wherein said plasma treatment is with a hydrogen-containing species thereby decreasing the work function by about 100 meV.

4. The electrical device of claim 1 wherein said layer is a substantially transparent conductor.

5. The electrical device of claim 4 wherein said substantially transparent conductor is indium-tin oxide.

6. The electrical device of claim 5 wherein said plasma treatment is an oxygen plasma treatment thereby increasing the work function by about 100 to about 300 meV.

7. The electrical device of claim 5 wherein said indium-tin oxide layer has an increased oxygen concentration at or near its surface.

8. The electrical device of claim 1 wherein said layer is platinum.

9. An organic light emitting device comprising:
a plasma treated contact layer;
an organic layer over said plasma treated contact layer; and
a second contact layer over said organic layer, said plasma treated contact layer comprising a contact layer having a work function, wherein said contact layer is treated with a plasma treatment selected from the group consisting of treatment with an oxygen-containing species thereby increasing the work function by about 100 to about 300 meV and treatment with a hydrogen-containing species thereby decreasing the work function by about 100 meV.

10. The organic light emitting device of claim 9 wherein said plasma treated contact layer is the product of a plasma treatment with an oxygen-containing species thereby increasing the work function by about 100 to about 300 meV.

11. The organic light emitting device of claim 9 wherein said plasma treated contact layer is the product of a plasma treatment with a hydrogen-containing species thereby decreasing the work function by about 100 meV.

12. The organic light emitting device of claim 9 wherein said plasma treated contact layer is a substantially transparent conductor.

13. The organic light emitting device of claim 12 wherein said substantially transparent conductor is indium-tin oxide.

14. The organic light emitting device of claim 13 wherein said plasma treated contact layer is the product of a plasma treatment with an oxygen-containing species thereby increasing the work function by about 100 to about 300 meV.

15. The organic light emitting device of claim 13 wherein said indium-tin oxide layer has an increased oxygen concentration at or near its surface.

16. The organic light emitting device of claim 9 wherein said plasma treated contact layer is platinum.

17. A method of modifying a work function of a conductor or semiconductor surface comprising:
selecting plasma treatment appropriate to modify said work function; and
subjecting said conductor or semiconductor to said plasma treatment, said plasma treatment selected from the group consisting of treatment with an oxygen-containing species thereby increasing the work function by about 100 to about 300 meV and treatment with a hydrogen-containing species thereby decreasing the work function by about 100 meV.

18. The method of claim 17 wherein said plasma treatment is with an oxygen-containing species thereby increasing the work function by about 100 to about 300 meV.

19. The method of claim 17 wherein said plasma treatment is with a hydrogen-containing species thereby decreasing the work function by about 100 meV.

20. The method of claim 17 wherein said conductor is a substantially transparent conductor.

21. The method of claim 20 wherein said substantially transparent conductor is indium-tin oxide.

22. The method of claim 21 wherein said plasma treatment is with an oxygen-containing species thereby increasing the work function by about 100 to about 300 meV.

23. The method of claim 21 wherein said indium-tin oxide layer has an increased oxygen concentration at or near its surface.

24. The method of claim 17 wherein said conductor is platinum.

25. A method of making an organic light emitting device comprising:
providing a first contact layer having a work function;
treating said first contact layer with a plasma;
placing an organic layer over said contact layer; and
placing a second contact layer over said organic layer, said step of treating said first contact layer comprising treating said first contact layer with a plasma treatment selected from the group consisting of treatment with an oxygen-containing species thereby increasing the work function by about 100 to about 300 meV and treatment with a hydrogen-containing species thereby decreasing the work function by about 100 meV.

26. The method of claim 25 wherein said plasma treatment is with an oxygen-containing species thereby increasing the work function by about 100 to about 300 meV.

27. The method of claim 25 wherein said plasma treatment is with a hydrogen-containing species thereby decreasing the work function by about 100 meV.

28. The method of claim 25 wherein said first contact layer is a substantially transparent conductor.

29. The method of claim 28 wherein said substantially transparent conductor is indium-tin oxide.

30. The method of claim 29 wherein said plasma treatment is with an oxygen-containing species thereby increasing the work function by about 100 to about 300 meV.

31. The method of claim 29 wherein said indium-tin oxide layer has an increased oxygen concentration at or near its surface.

32. The method of claim 25 wherein said first contact layer is platinum.

33. The of electrical device claim 1, wherein said plasma treatment is conducted at a power density ranging from about 25 to about 200 mW/cm$^2$.

34. The organic light emitting device of claim 9, wherein said plasma treated contact layer is subjected to a plasma treatment conducted at a power density ranging from about 25 to about 200 mW/cm$^2$.

35. The method of claim 17, wherein said plasma treatment is conducted at a power density ranging from about 25 to about 200 mW/cm$^2$.

36. The method of claim 25, wherein said step of plasma treatment is conducted at a power density ranging from about 25 to about 200 mW/cm$^2$.

37. An apparatus incorporating the electronic device of claim 1, said article selected from the group consisting of a computer, a television, a billboard, a sign, a vehicle, a printer, a telecommunications device, a telephone, and a copier.

38. An apparatus incorporating the organic light emitting device of claim 9, said article selected from the group consisting of a computer, a television, a billboard, a sign, a vehicle, a printer, a telecommunications device, a telephone, and a copier.

* * * * *

UNITED STATES PATENT AND TRADEMARK OFFICE
CERTIFICATE OF CORRECTION

PATENT NO.    : 6,259,202 B1
DATED         : July 10, 2001
INVENTOR(S)   : Wu et al.

It is certified that error appears in the above-identified patent and that said Letters Patent is hereby corrected as shown below:

<u>Title page,</u>
Item [56], References Cited, OTHER PUBLICATIONS, change "Distryrylarylene" to -- distrylarylene --.

Signed and Sealed this

Third Day of December, 2002

JAMES E. ROGAN
*Director of the United States Patent and Trademark Office*